(12) United States Patent
Washio

(10) Patent No.: US 6,541,696 B2
(45) Date of Patent: Apr. 1, 2003

(54) SOLAR CELL AND FABRICATION METHOD THEREOF

(75) Inventor: Hidetoshi Washio, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 09/778,035

(22) Filed: Feb. 7, 2001

(65) Prior Publication Data
US 2001/0017154 A1 Aug. 30, 2001

(30) Foreign Application Priority Data

Feb. 9, 2000 (JP) ........................................ 2000-031469

(51) Int. Cl.⁷ ........................................... H01L 31/0236
(52) U.S. Cl. .......................... 136/255; 136/256; 438/71; 438/72
(58) Field of Search ................................ 136/252, 255, 136/256; 438/71, 72, 745

(56) References Cited

U.S. PATENT DOCUMENTS 6,313,397 B1 * 11/2001 Washio et al. ............... 136/256

FOREIGN PATENT DOCUMENTS

| JP | 5-110121 | 4/1993 |
| JP | 9-83002 | 3/1997 |
| JP | 10-163511 | 6/1998 |
| JP | 2000-150937 | 5/2000 |

OTHER PUBLICATIONS

Suzuki, Akia. "High–efficiency silicon space solar cells". Solar Energy Materials and Solar Cells 50 (1998). Pp. 289–303.*

* cited by examiner

Primary Examiner—Nam Nguyen
Assistant Examiner—Brian L Mutschler
(74) Attorney, Agent, or Firm—Nixon & Vanderhye P.C.

(57) ABSTRACT

A high-efficiency bypass function added solar cell includes a first conductivity type substrate, a second conductivity type region formed at the light receiving side of the substrate, an electrode formed at the second conductivity type region, and a region of higher concentration than the substrate, arranged in contact with both the substrate and the second conductivity type region and not in contact with the electrode. The substrate includes a reflectionless surface construction and a planer portion at the light receiving side. The reflectionless surface construction has a plurality of grid configurations, and includes a first grid portion and a second grid portion having a grid configuration differing in size from that of the first grid portion. The region of higher concentration than the substrate is formed at the first grid portion.

8 Claims, 18 Drawing Sheets 13b  13a  10

10  13a  13c

← ELECTRIC FIELD CONCENTRATION REGION

← ELECTRIC FIELD CONCENTRATION REGION

SOLAR CELL AND FABRICATION METHOD THEREOF

BACKGROUND OF THE INVENTION

1. Field of the Invention

The present invention relates to a solar cell and a fabrication method thereof, particularly a solar cell with a bypass function including the function of a bypass diode that protects the solar cell from reverse bias voltage generated when, for example, the solar cell module is shadowed, and a method of fabricating such a solar cell.

2. Description of the Background Art

A solar cell module has a plurality of solar cells combined in series or in parallel to obtain a predetermined output voltage and output current. In the event of some of the cells being shadowed, voltage generated by the other cells will be applied in the reverse direction.

When the reverse breakdown voltage of the shadowed cells is surpassed by the reverse bias voltage applied in the reverse direction, breakdown occurs at the relevant cells to result in a great flow of current. There is a possibility of short-circuit failure occurring in these cells. Eventually, the output property of the entire solar cell module is degraded.

In the case of a solar cell module for use in space, the shadow of a portion of the satellite or any structural member such as the antenna may fall on the solar cell module during control of the posture of the satellite. In the case of a solar cell module for terrestrial use, the cells may be shadowed by an adjacent building or by droppings of a bird or the like.

Consider the case where a shadow falls on the submodule of a solar cell module formed of a series of solar cells connected in parallel.

FIGS. 12A and 12B show a structure of a conventional solar cell module.

In a shunt mode where both ends of a solar cell module M are substantially short-circuited as shown in FIG. 12A, power $V_{12}$ generated by a group of submodules 12 not shadowed is applied as a reverse bias voltage to the shadowed submodule 11. Therefore, $V_{11}=-V_{12}$, where $V_{11}$ is the voltage of submodule 11.

In the case where an external power source $V_B$ is connected to solar cell module M as shown in FIG. 12B, the voltage of submodule 11 becomes $V_{11}=V_B-V_{12}$. Positive charge is applied to the N electrode of shadowed submodule 11. When the reverse bias voltage thereof exceeds the reverse breakdown voltage of the solar cells forming submodule 11, breakdown occurs at that solar cell, resulting in the possibility of short-circuit failure. Accordingly, the output property of the shadowed module 11 is degraded, which in turn degrades the entire solar cell module M.

In order to prevent the disadvantage caused by such reverse bias voltages, a bypass diode may be attached for each solar cell or for every unit of specific modules. Alternatively, the so-called diode integrated solar cell having a bypass diode integrated with the solar cell is used.

Furthermore, a solar cell added with the bypass diode function is known. An example of a structure of a conventional solar cell with the bypass diode function will be described here with reference to the drawings.

FIG. 13 is a perspective view of a high-efficiency bypass diode function added solar cell with a reflectionless surface construction.

Referring to FIG. 13, the conventional solar cell includes a silicon substrate 1 of a first conductivity type such as the P type, a region of a second conductivity type such as the N type formed at the light receiving plane of substrate 1 to efficiently collect carriers generated by light energy, a $P^+$ region 3 formed at the bottom plane of substrate 1 for the back surface field (BSF) effect, an island-like $P^+$ region 4 provided at a portion of the light receiving plane of substrate 1 for bypass, an N electrode 7 provided at the surface of the N type region to obtain generated electricity efficiently, an anti-reflection film 8 covering substantially the entire plane of the N type region except for an N electrode connection portion not shown to reduce the surface reflection of incident light, and a P electrode 6 covering substantially the entirety of the bottom plane of $P^+$ region 4 to reflect light of a long wavelength passing through the bottom plane and to produce the generated electricity. The solar cell also includes a gridded reflectionless surface construction 13 provided at the light receiving side to reduce surface reflection, formed of a grid configuration having a plurality of recesses in the shape of upside down pyramids, and an oxide film layer 9 (not shown) on the N+ diffusion layer to reduce recombination of carriers at the surface. An oxide film layer 5 is provided on $P^+$ diffusion layer 3 to reduce recombination of carriers at the bottom face of P type silicon substrate 1. $N^+$ diffusion layer 2 and surface electrode 7 are connected via an opening not shown in the oxide film layer. $P^+$ diffusion layer 3 and back electrode 6 are connected via an opening in oxide film layer 5.

In a solar cell of the above-described structure, reflectionless surface construction 13 formed at the light receiving side serves to multiple-reflect the incident light to increase the quantity of light arriving inside the solar cell. The generated power depends upon the formation thereof. Therefore, the setting of the method of forming this configuration is extremely critical. In the present solar cell, reflectionless surface construction 13 is formed all over except for the region where surface electrode 7 is formed and the region of the ends of the solar cell.

FIG. 14 is a top view of the solar cell of FIG. 13, showing a circular region 10 for the $P^+$ diffusion region.

Referring to FIG. 14, the size and shape of each grid unit are identical. Therefore, the interval between each grid unit of the reflectionless surface construction is all identical.

A method of fabricating such a conventional solar cell of the above structure will be described hereinafter.

FIGS. 15A–15G and FIGS. 16A–16E are sectional views of the solar cell of FIG. 13 to describe a fabrication method thereof.

The reflectionless surface construction is fabricated according to the steps of FIGS. 15A–15G.

Referring to FIG. 15A, a silicon substrate 1 of plane orientation (100) is prepared.

Referring to FIG. 15B, oxide film 9 is formed by thermal oxidation or CVD at the surface of silicon substrate 1.

Referring to FIG. 15C, a resist 15 is applied on oxide film 9.

Referring to FIG. 15D, a predetermined pattern of reflectionless surface construction 13 and the portion of the alignment mark not shown are exposed and developed at the light receiving side. As a result, the pattern to form the reflectionless surface construction and the pattern of the alignment mark are formed by means of resist 15 on oxide film 9.

Referring to FIG. 15E, oxide film 9 of the unrequired region is removed by etching or the like. Then, resist 15 is removed. Thus, the pattern of the reflectionless surface construction by oxide film 9 and the pattern of the alignment mark not shown are provided on silicon substrate 1. At this stage, the distance d between the grid units is determined.

Referring to FIG. 15F, etching is applied for a predetermined time using an etching solution of a predetermined temperature and concentration such as a high temperature alkaline solution. For silicon substrate 1, the etching rate with respect to the chemical substance differs for each crystal plane. By means of anisotropic etching thereof, a fine reflectionless surface construction 13 can be formed. At this stage, the alignment mark region takes a recess configuration.

Referring to FIG. 15G, oxide film 9 is removed, completing the formation of reflectionless surface construction 13 and the alignment mark not shown at the light receiving side of silicon substrate 1.

The structure of providing the bypass function to the solar cell of FIG. 13 is achieved by the fabrication steps of FIG. 16A–16E corresponding to sectional views of the solar cell.

Referring to FIG. 16A, P type silicon substrate 1 having reflectionless surface construction 13 and an alignment mark region not shown formed at the light receiving side obtained by the foregoing method is prepared.

Referring to FIG. 16B, oxide film 9 is formed by thermal oxidation or the like at the surface of P type silicon substrate 1.

Referring to FIG. 16C, oxide film 9 at the backside is removed, and a plurality of openings 14 are formed by photolithography or the like in oxide film 9 at the surface side. The plurality of openings 14 correspond to island-like $P^+$ region 4 that will be formed afterwards.

P+ impurities having an impurity concentration of approximately $1 \times 10^{20}$ cm$^{-3}$, for example, are diffused into this wafer. Then, by removing oxide film 9 from the surface and the side, the wafer as shown in FIG. 16D is obtained. This wafer has a plurality of island-like $P^+$ regions 4 formed at the surface by boron diffusion, and $P^+$ region 3 formed all over the backside in the case of the all-surface BSF type.

Referring to FIG. 16E, N type region 2 is formed at the top surface and side face by thermal diffusion or the like. Since island-like $P^+$ region 4 is protected by the boron glass remaining at the surface, the island of $P^+$ region 4 is left in N region 2. The outer circumferential portion of island-like $P^+$ region 4 is identical to circular region 10 at the surface of texture configuration 13 shown in FIG. 14.

Then, using the alignment mark region, the surface electrode is formed by photolithography or the like so that the island of $P^+$ region 4 is formed between the grid units, and an anti-reflection film or the like is formed.

FIG. 17 is a perspective view of another conventional solar cell showing another structure. This solar cell with the bypass diode function does not have a reflectionless surface construction.

FIG. 18 is a top view of the solar cell of FIG. 17.

The solar cell of FIGS. 17 and 18 differs from the solar cell described with reference to FIG. 13 in the absence of reflectionless surface construction 13.

The structure to provide the solar cell of FIG. 17 with the bypass function is fabricated by the steps of FIGS. 19A–19G corresponding to sectional views thereof.

Referring to FIG. 19A, P type silicon substrate 1 is prepared.

Oxide film 9 is formed by thermal oxidation or the like at the surface of P type silicon substrate 1, resulting in the structure of FIG. 19B.

Referring to FIG. 19C, an opening 20 is formed by photolithography or the like in oxide film 9 corresponding to the alignment mark region provided at the outer side to the cell pattern at the surface of P type silicon substrate 1.

Then, the wafer is subjected to etching for a short period of time using an alkaline solution, whereby the alignment mark region of P type silicon substrate 1 is etched to a recess configuration, resulting in the wafer of FIG. 19D with an alignment mark of a recess 21.

Then, oxide film 9 at the backside is removed, and a plurality of openings 14 are formed by photolithography in oxide film 9 located at the surface to result in FIG. 19E. Openings 14 correspond to island-like $P^+$ regions 4 that will be formed afterwards. $P^+$ type impurities of approximately $1 \times 10^{20}$ cm$^{-3}$ in impurity concentration are diffused to the wafer.

By removing oxide film 9 from the surface and the side face, a plurality of island-like $P^+$ regions 4 are formed at the surface by, for example, boron diffusion, and $P^+$ region 3 is formed all over the backside in the case of the back surface field reflector (BSFR) type, resulting in the wafer shown in FIG. 19F.

Referring to FIG. 19G, N type region 2 is formed by thermal diffusion or the like at the surface and the side face. Island-like $P^+$ region 4 and the surface of $P^+$ region 3 at the backside have boron glass remaining thereon so as to be protected. Therefore, the island of $P^+$ region 4 remains in N region 2 at the light receiving side.

Island-like $P^+$ region 4 is formed between the surface electrode grids by photolithography or the like using alignment mark recess 21 formed as described above. The process steps of FIGS. 19C and 19D are necessary since $P^+$ region 4 cannot be formed between the surface electrode grids if there is no alignment mark recess 21. Then, anti-reflection film 8 and the like are formed.

A plurality of such solar cells are connected in parallel as shown in FIG. 12A to be used as the general solar cell module M under the predetermined voltage and current. If reverse bias voltage is applied to the solar cell of the above-described structure, the $P^+N$ junction of the region of the second conductivity type (for example N type) at the light receiving side and the region of the first conductivity type (for example, P type) of high concentration formed in contact with the second conductivity type region is reversely biased. Zener effect easily occurs at this portion by the PN junction established by the first conductivity type substrate and the second conductivity type diffusion layer to cause breakdown.

When current is generated in the reverse direction at this region where a relatively small reverse bias voltage is applied, increase in the reverse bias voltage causes the Zener effect. This will prevent the reverse bias voltage from being applied to the body of the solar cell. This will be described with reference to an equivalent circuit diagram of a solar cell with a bias function shown in FIG. 20.

FIG. 20 corresponds to the structure in which an $NP^+$ diode is connected in parallel to the solar cell formed of an NP junction. When reverse bias voltage is applied, the current of the $NP^+$ diode that has a great leakage current in the opposite direction flows. Therefore, the solar cell is protected from breakdown. Island-like $P^+$ type region 4 has a structure in which breakdown occurs by the Zener effect caused by the PN junction formed between island-like $P^+$ region 4 and N type region 2 by increasing the impurity concentration higher than that of P type silicon substrate 1. The impurity concentration of $P^+$ region 4 is to be set to at least $1\times10^{18}$ cm$^{-3}$ to cause the Zener effect. It is to be noted that the output of the solar cell will be degraded as the total area of island-like P$^+$ region 4 becomes larger. Therefore, designing is necessary to set the total area of P region 4 as small as possible within the range where the solar cell is not fractured while causing Zener breakdown.

Solar cells with island-like bypass regions provided are disclosed in Japanese Patent Laying-Open Nos. 5-110121 and 10-163511.

However, the conventional high-efficiency bypass function added solar cells with the reflectionless surface construction had the problem that the bypass function could not be easily achieved since reverse current of a satisfactory level could not be obtained. Although the reverse current can be increased by enlarging the area of the P$^+$ region formed on the reflectionless surface construction to provide the bypass function, the N type diffusion region at the light receiving side will have to be reduced corresponding to the increase of the P$^+$ region. This means that the output of the solar cell is degraded. Thus, increasing the reverse current without changing the area of the P$^+$ region formed on the reflectionless surface construction was an issue.

The conventional bypass function added solar cell absent of the reflectionless surface construction has a greater number of fabrication processing steps than those of the solar cell that does not have the bypass function. There was also the problem that the bypass function could not be easily achieved since reverse current of a satisfactory level could not be obtained.

For the BSFR type solar cell that has, for example, a P type diffusion region at the backside or the back surface reflector (BSR) type solar cell (not shown) that does not have a P type diffusion region, the alignment mark region is indispensable to form P$^+$ regions 4 between the N electrode grids shown in FIG. 17. The photolithography step to form such alignment marks is necessary. Therefore, the fabrication process is increased significantly than the process of the solar cell that does not have the bypass function.

SUMMARY OF THE INVENTION

An object of the present invention is to provide a structure and a fabrication method of a high-efficiency bypass function added solar cell with a reflectionless surface construction to increase reverse current without altering the area of the P$^+$ type region formed on the reflectionless surface structure, overcoming the problems of the conventional art.

Another object of the present invention is to provide a structure and a fabrication method of a bypass function added solar cell absent of a reflectionless surface construction, having a reverse current greater than that of the conventional case without hardly increasing the fabrication process.

According to the present invention, the above objects can be achieved by a solar cell set forth in the following.

According to an aspect of the present invention, a solar cell includes a substrate of a first conductivity type, a region of a second conductivity type formed at a light receiving side of the substrate, an electrode formed at the region of the second conductivity type, and a region of higher concentration than the substrate, arranged in contact with both the substrate and the region of the second conductivity type, and not in contact with the electrode. The substrate includes a reflectionless surface construction and a planar portion. The reflectionless surface structure has a plurality of grid configurations, and includes a first grid portion and a second grid portion having a grid configuration differing in size from that of the first grid portion. The region of higher concentration than the substrate is formed at the first grid portion.

According to another aspect of the present invention, the size of each grid configuration of the first grid portion of the reflectionless surface construction is greater than each grid configuration of the second grid portion.

According to a further aspect of the present invention, the first and second grid portions of the reflectionless surface construction have different grid configurations.

According to still another aspect of the present invention, the distance between the grids of the first grid portion differs from the distance between the grids of the second grid portion in the reflectionless surface construction.

According to a still further aspect of the present invention, the distance between the grids of the first grid portion is smaller than the distance between the grids of the second grid portion in the reflectionless surface structure.

According to yet a further aspect of the present invention, a solar cell includes a substrate of a first conductivity type, a region of a second conductivity type formed at a light receiving side of the substrate, an electrode formed at the region of the second conductivity type, and a region of higher concentration than the substrate, arranged in contact with both the substrate and the region of the second conductivity type, and not in contact with the electrode. The region of higher concentration than the substrate is formed in a recess.

According to yet another aspect of the present invention, a method of fabricating a solar cell is provided. The solar cell of the present aspect includes a substrate of a first conductivity type, a region of a second conductivity type formed at a light receiving side of the substrate, an electrode formed at the region of the second conductivity type, and a region of higher concentration than the substrate, arranged in contact with both the substrate and the region of the second conductivity type, and not in contact with the electrode. The substrate includes a reflectionless surface construction and a planar portion at the light receiving side. The reflectionless surface construction has a plurality of grid configurations, and is formed of a first grid portion and a second grid portion having a grid configuration differing in size than that of the first grid portion. The region of higher concentration than the substrate is formed at the first grid portion. The fabrication method includes the step of forming a masking pattern on the substrate using an oxide film, and etching the substrate with the masking pattern as a mask. The line width of the masking pattern located at the second grid portion is larger than the line width of the masking pattern located at the first grid portion.

According to yet a still further aspect of the present invention, a fabrication method of a solar cell is provided. The solar cell of the present aspect includes a substrate of a first conductivity type, a region of a second conductivity type formed at a light receiving plane of the substrate, an electrode formed at the region of the second conductivity type, and a region of higher concentration than the substrate, arranged in contact with both the substrate and the region of the second conductivity type and not in contact with the electrode. The region of higher concentration than the substrate is formed in a recess. The fabrication method includes the steps of etching the portion of a window of a patterned surface oxide film using an alkaline solution to form a recess, and forming the region of higher concentration by diffusing impurities with the surface oxide film as a diffusion mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter.

The solar cell of the present invention includes a first conductivity type substrate, a second conductivity type region formed at the light receiving side of the substrate, an electrode formed at the second conductivity type region, and a region of higher concentration than the substrate, arranged in contact with both the substrate and the second conductivity type region, and not in contact with the electrode. The substrate includes a reflectionless surface construction and a planar portion at the light receiving side. The reflectionless surface construction has a plurality of grid configurations, formed of a first grid portion and a second grid portion having a grid configuration differing in size from that of the first grid portion. The region of higher concentration than the substrate is formed at the first grid portion.

The size of each grid of the first grid portion is preferably larger than each grid of the second grid portion in the reflectionless surface construction.

The first and second grid portions of the reflectionless surface construction preferably have different grid configurations.

The distance between the grids of the first grid portion preferably differs from the distance between the grids of the second grid portion in the reflectionless surface construction.

In the reflectionless surface construction, the distance between the grids of the first grid portion is preferably smaller than the distance between the grids of the second grid portion.

Figure 3:
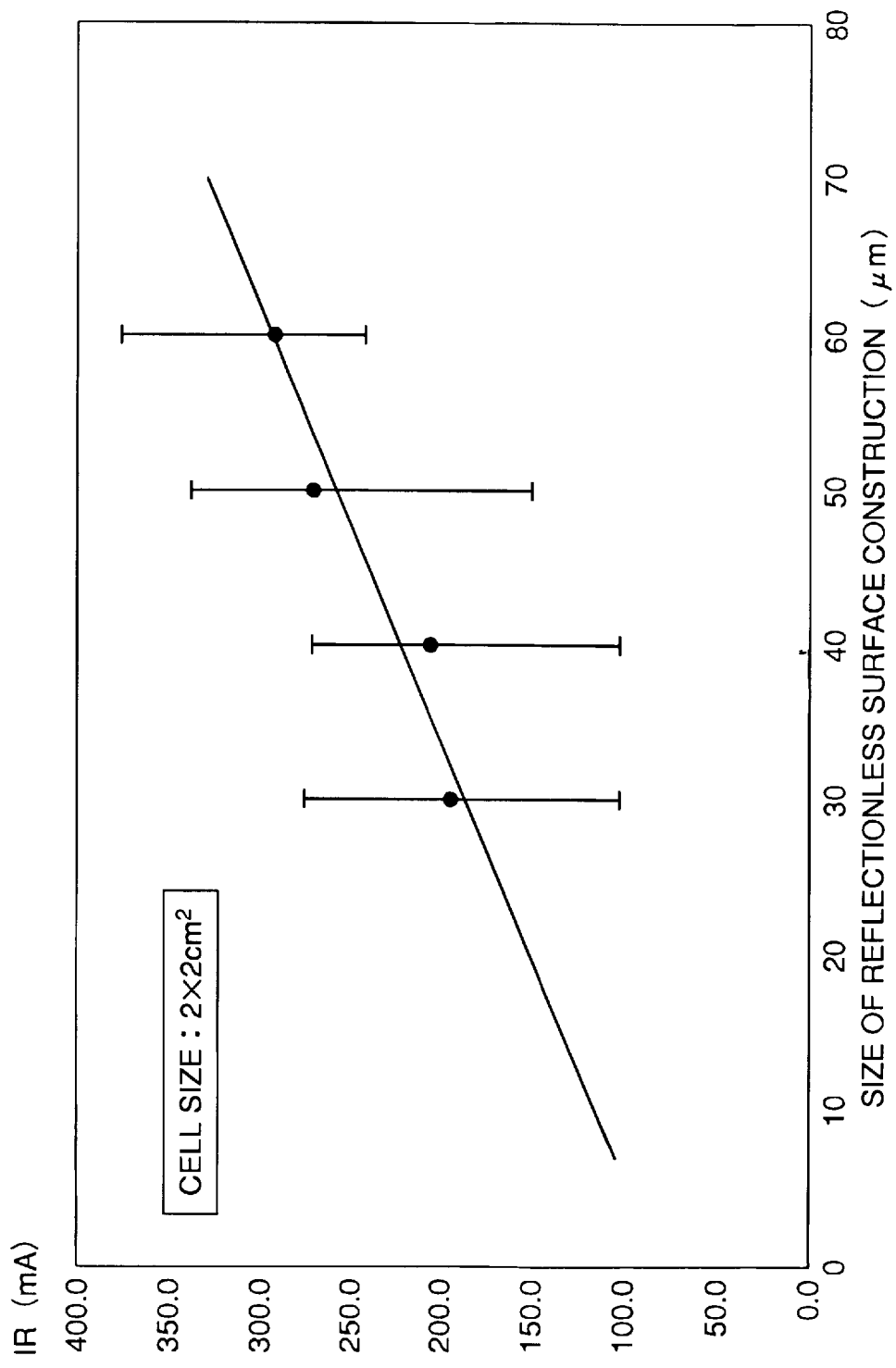
FIG. 3 represents the correlation between the size of the reflectionless surface construction and reverse current.

FIG. 3 represents the correlation between the size of the reflectionless surface construction along the horizontal axis and reverse current (IR) along the vertical axis.

Figure 21A:
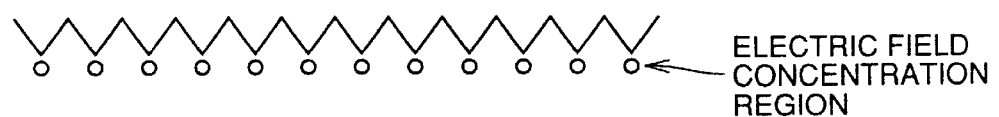
FIGS. 21A and 21B are diagrams to describe the texture.
Figure 21B:
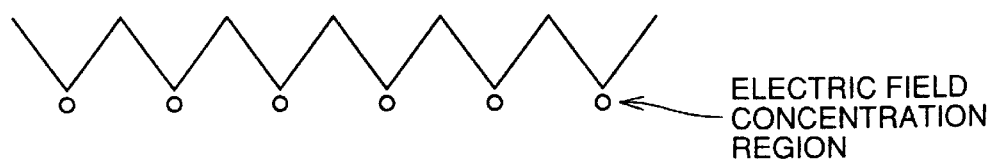

It is appreciated from FIG. 3 that the reverse current increases as the size of the reflectionless surface construction increases. This means that the reverse current can be increased by setting the reflectionless surface construction of the region that is subjected to patterning to provide the bypass function larger than the other portions. This provides the advantage that the patterned region does not have to be enlarged. The reason thereof is set forth in the following. The surface texture in the P$^+$ region is angular, so that the electric field easily gathers at the vertex. As shown in FIG. 21A, the fine texture has more vertices of the pyramids per unit area than the coarser texture shown in FIG. 21B. Therefore, the voltage applied to each vertex is smaller for the portion of the fine texture than the portion of the coarse texture. As a result, leakage current is reduced.

In the above-described structure, the distance between the grids of the first grid portion having large grid configurations can be set different from the distance between the grids of the second grid portion having smaller grid configurations. Here, it is desirable that the distance between the grids of the second grid portion having smaller grid configurations is set larger than the distance between the grids of the first grid portion having large grid configurations.

The fabrication method of the solar cell of the present invention is directed to form the grid configuration of the reflectionless surface construction corresponding to the region that is to be subjected to patterning to provide the bypass function so as to be different in size from other portions. Using an oxide film on the substrate, a masking pattern is formed so that the line width of the masking pattern located at the formation region of the second grid portion having small grid configurations is greater than the line width of the masking pattern located at the formation region of the first grid portion having large grid configurations. By etching the substrate using the masking pattern as a mask, a reflectionless surface construction of, for example, a lattice configuration, is provided.

By setting the grid configurations of the portion that is to be subjected to patterning to provide the bypass function and the peripheral portion of the reflectionless surface construction larger than those of other portions, the reverse current can be increased than that of the conventional solar cell. The reverse current can be increased without enlarging the patterning region to provide the bypass function. Thus, a solar cell can be provided that has great reverse current without degrading the output property.

The solar cell of the present invention includes a first conductivity type substrate, a second conductivity type region formed at the light receiving side of the substrate, an electrode formed at the second conductivity type region, and a region of higher concentration than the substrate, arranged in contact with both the substrate and the second conductivity type region and not in contact with the electrode. The region of higher concentration than the substrate is formed in a recess.

Figure 10:
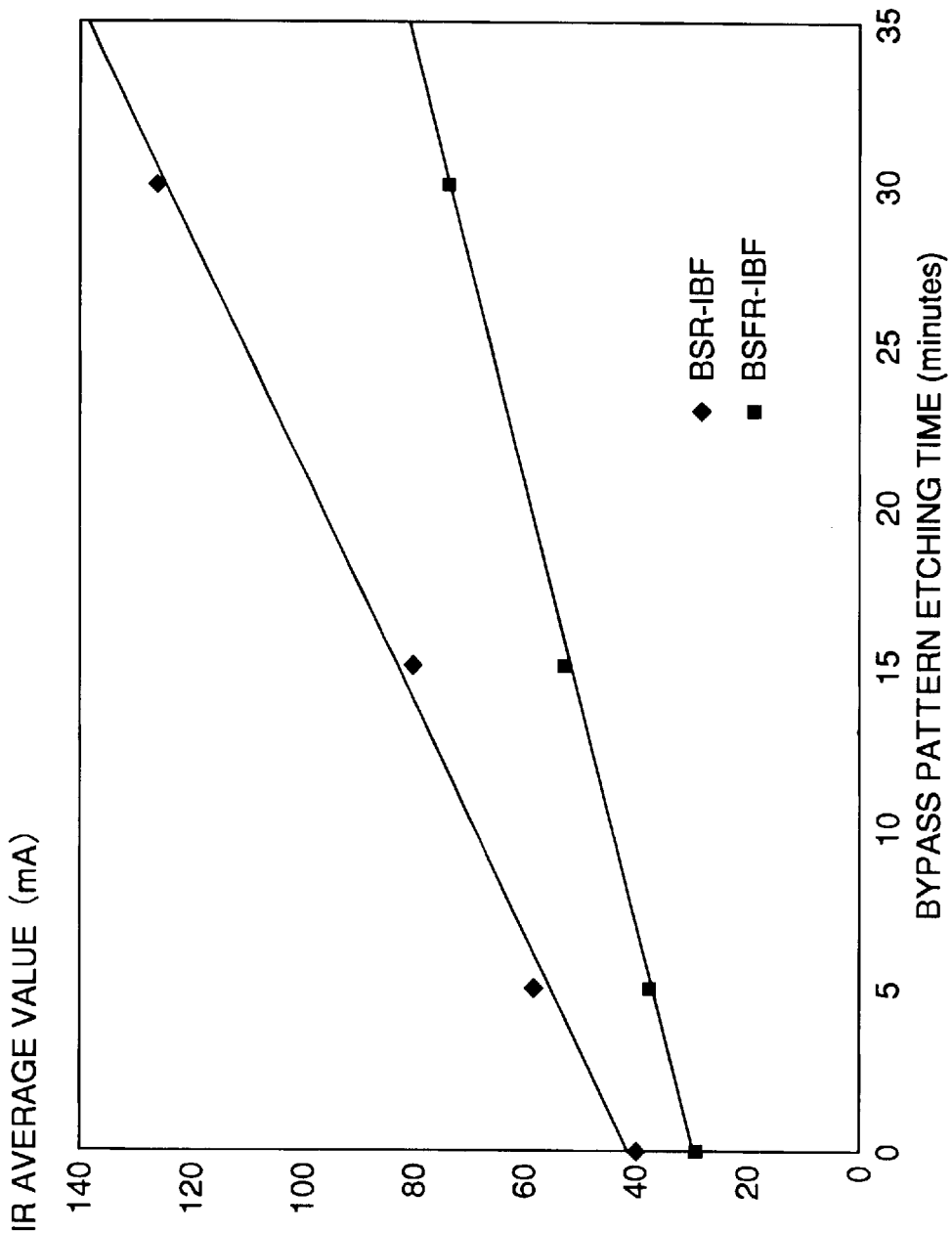
FIG. 10 represents the correlation between the etching process time and reverse current.

FIG. 10 represents the correlation between the etching processing time along the horizontal axis and the reverse current along the vertical axis.

It is appreciated from FIG. 10 that the reverse current is increased by extending the etching processing time. The solar cell of the present invention can have the reverse current increased even if the area of the patterning portion to provide the bypass function is identical.

The fabrication method of such a solar cell is characterized in that the high concentration region is formed by etching the portion of the window of the patterned surface oxide film to obtain a recess, and then diffusing impurities with the surface oxide film as the diffusion mask.

The fabrication method of the solar cell is characterized in forming the pattern configuration to provide the bypass function in a recess. Formation of the recess is effected using an alkaline solution or the like. By increasing the etching processing time to set the recess deeper, a larger reverse current can be obtained even with the same area of the patterning portion.

This fabrication method allows the alignment mark portion to be formed on the wafer during the process of forming the pattern configuration to provide the bypass function in a recess. The number of steps of photolithography can be reduced, which in turn reduces the fabrication cost.

The formation of the pattern to provide the bypass function in a recess provides the advantage that the reverse current is increased without increasing the patterning region to provide the bypass function in addition to the improvement of productivity in comparison to those of the conventional solar cells. Thus, a solar cell that has a large reverse current without degrading the output property can be provided.

Figure 1:
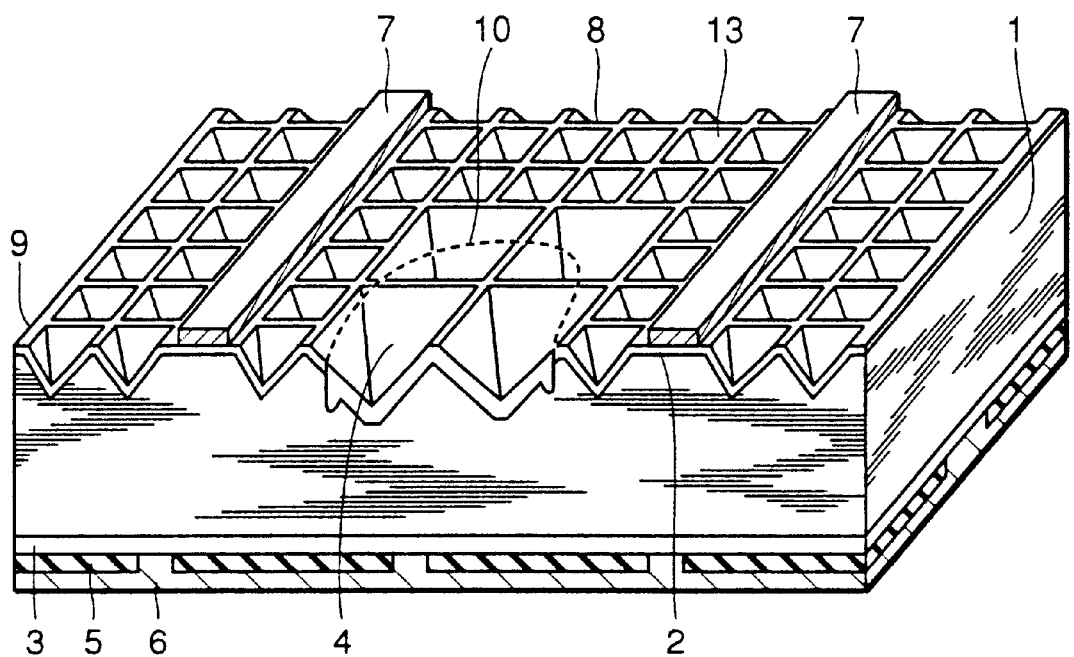
FIG. 1 is a perspective view of a high-efficiency bypass function added solar cell having a reflectionless surface structure according to an embodiment of the present invention.

FIG. 1 is a perspective view of a high-efficiency bypass function added solar cell having a reflectionless surface structure according to an embodiment of the present invention.

Figure 2:
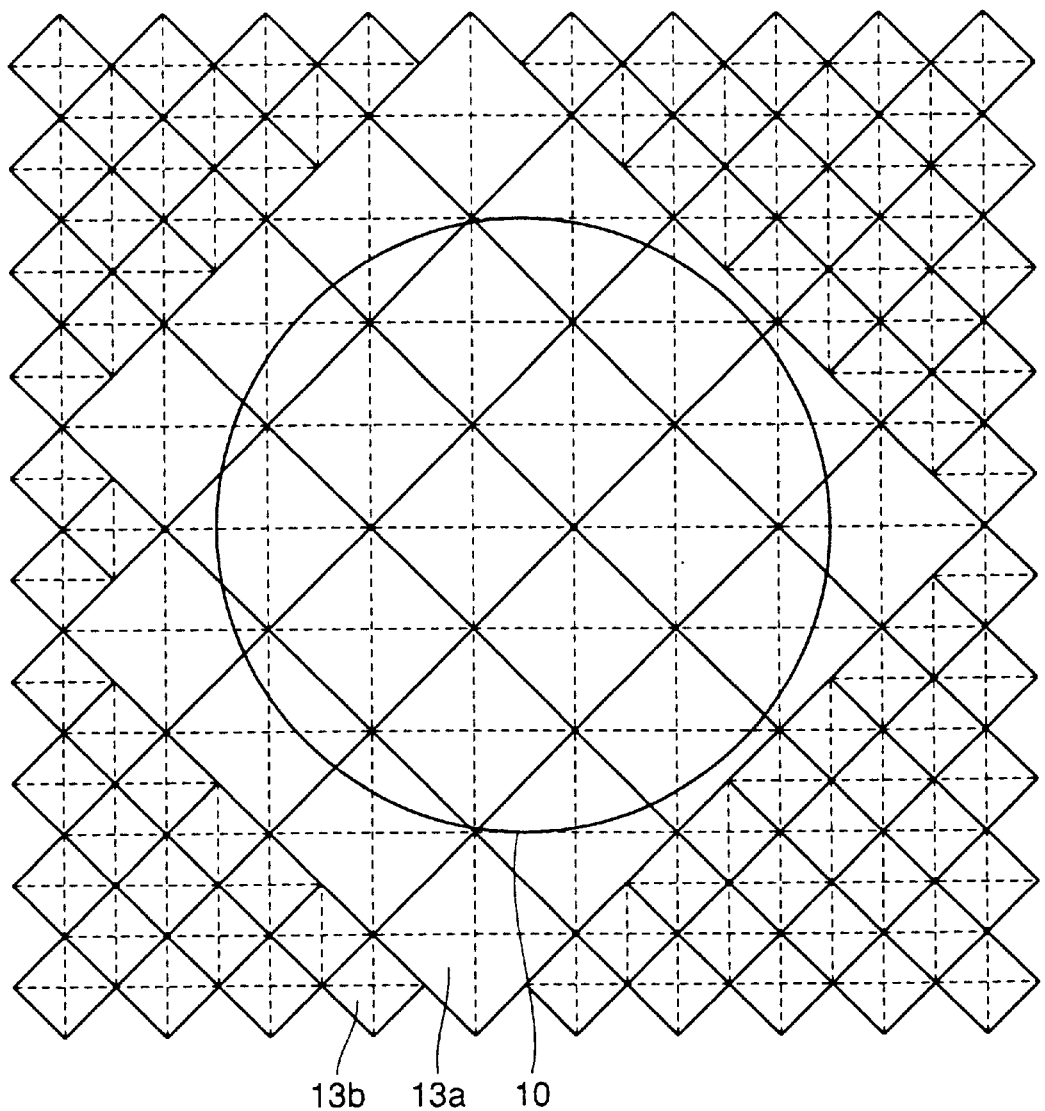
FIG. 2 is a top view of the solar cell of FIG. 1.
Figure 13:
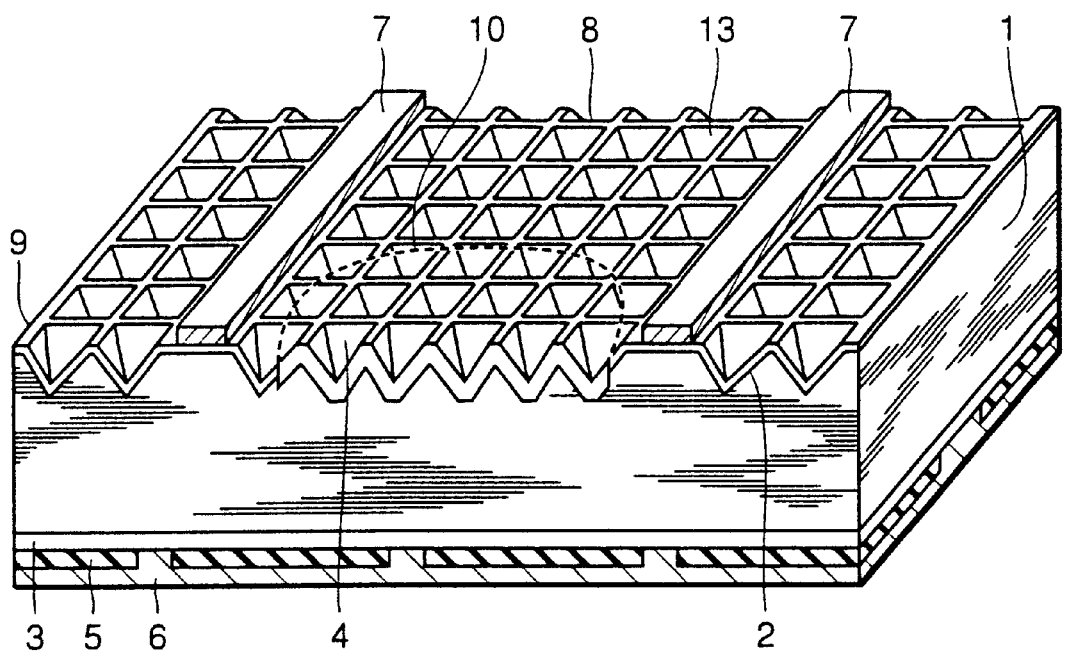
FIG. 13 is a perspective view showing an example of a structure of a conventional solar cell.
Figure 14:
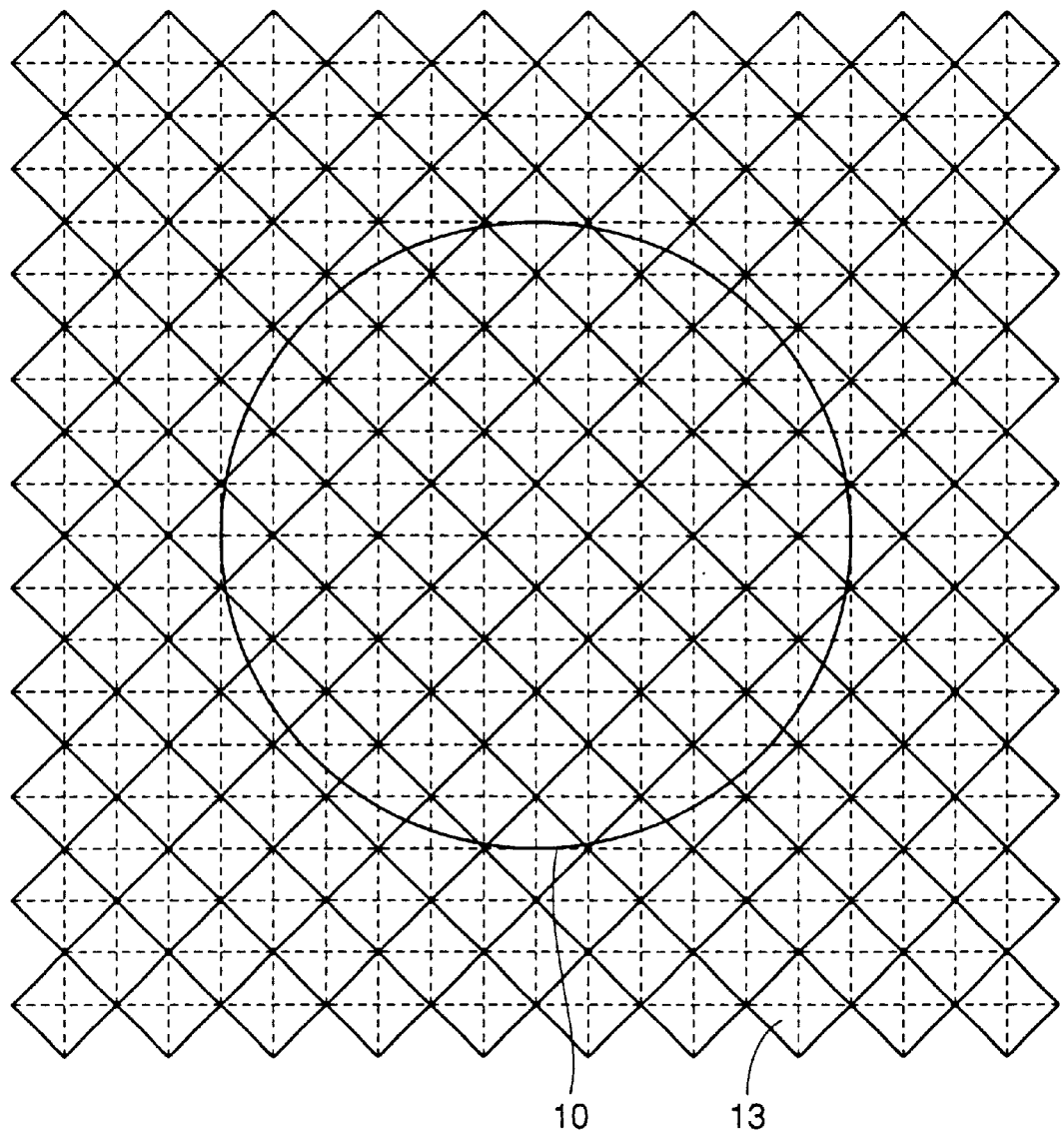
FIG. 14 is a top view of the solar cell of FIG. 13.

FIG. 2 is an enlarged top view of the solar cell of FIG. 1, corresponding to the conductivity type region to provide the bypass diode function of the present invention. Referring to FIG. 2, a conductivity type region 10 to provide the bypass diode function is formed in the reflectionless surface construction. FIGS. 1 and 2 correspond to FIGS. 13 and 14, respectively, described with reference to prior art. Elements corresponding to those of the conventional case have the same reference character allotted.

The solar cell of the present embodiment differs from the conventional solar cell shown in FIG. 1 in that an island-like P+ region 4 provided at the light receiving side has a grid portion of a grid configuration differing in size from the portions formed on the reflectionless surface construction. More specifically, the size of a reflectionless surface construction 13a corresponding to the portion of the conductivity type region to provide the function of a bypass diode is set larger than the other portion 13b.

The fabrication steps and sequence of the above solar cell of the present invention are similar to those of the conventional case described with reference to FIGS. 16A–16E. It is desirable that the distance between each grid in respective grid portions of the reflectionless surface construction is altered in the solar cell of the present invention since the size of the reflectionless surface construction differs. More specifically, the distance between each grid of the second grid portion having smaller grid configurations must be set greater than the distance between each grid of the first grid portion having the larger grid configurations in the reflectionless surface construction. This will be described in detail hereinafter.

FIGS. 4A and 4B and FIGS. 5A and 5B are sectional views of the solar cell of FIG. 1 to describe the fabrication method thereof.

Figure 4A:
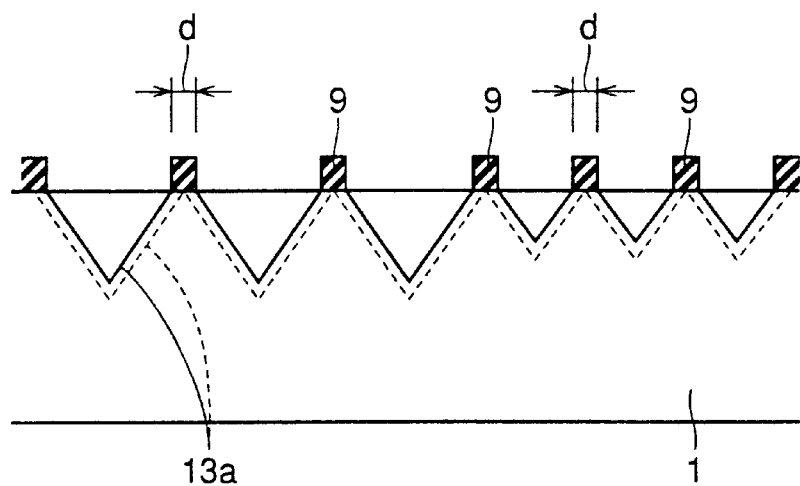
FIGS. 4A and 4B and FIGS. 5A and 5B are sectional views of the solar cell of FIG. 1 to describe a fabrication method thereof.
Figure 4B:
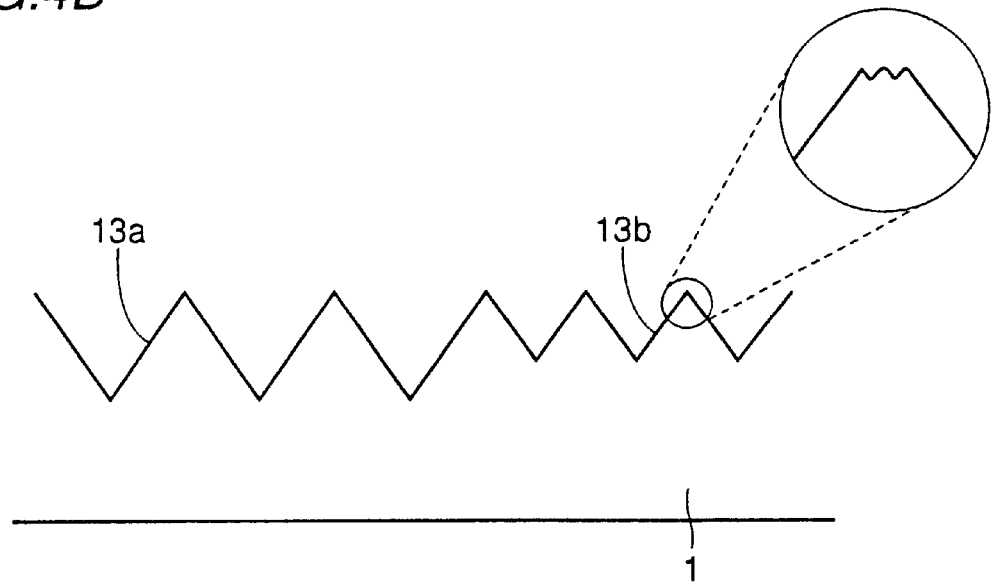
Figure 5A:
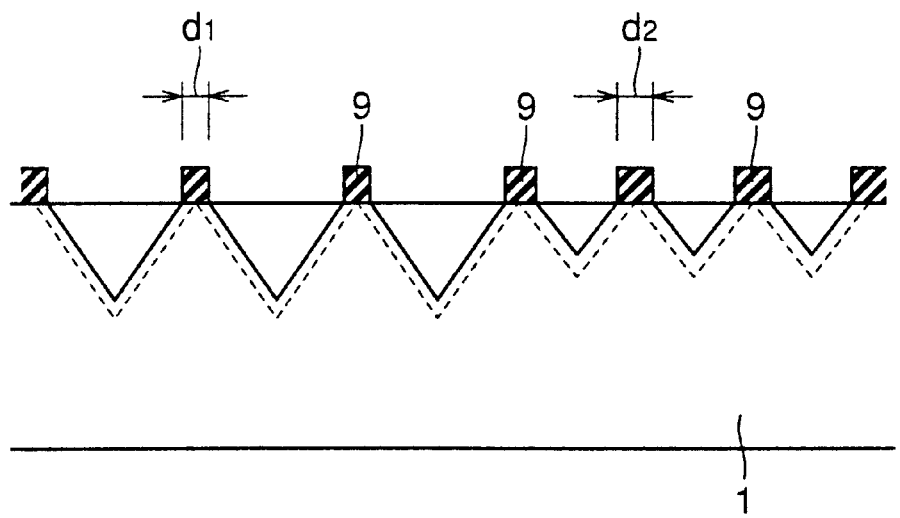
Figure 5B:
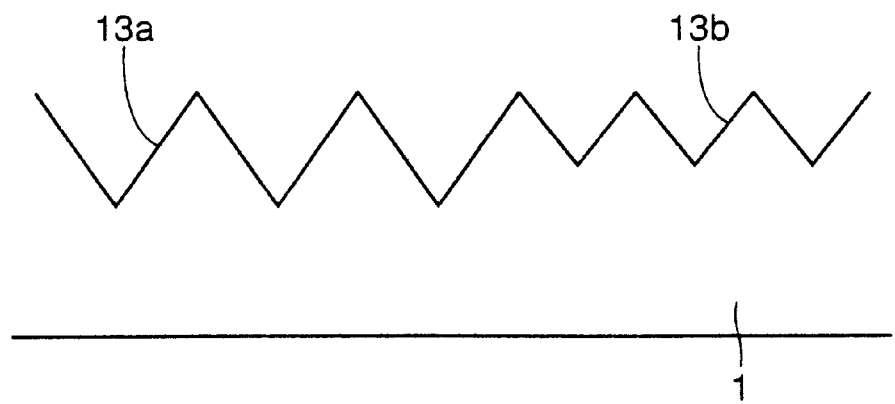
Figure 15A:
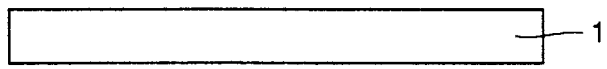
FIGS. 15A–15G and FIGS. 16A–16E are sectional views of the solar cell of FIG. 13 to describe a fabrication method thereof.
Figure 15B:
Figure 15C:
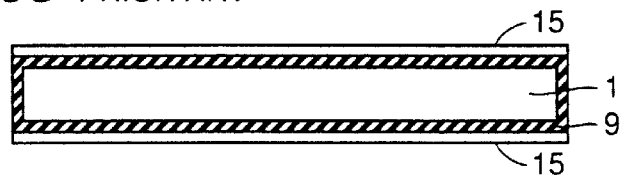
Figure 15D:
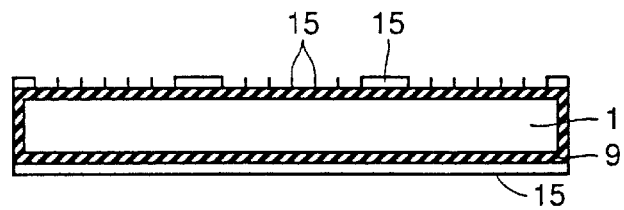
Figure 15E:
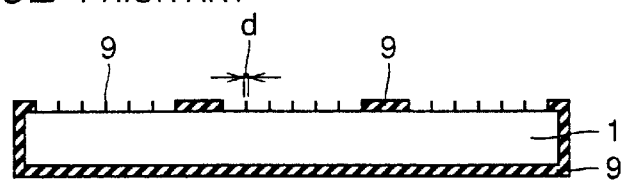
Figure 15F:
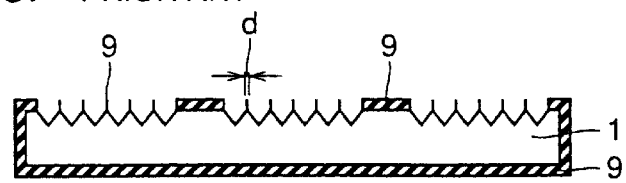
Figure 15G:
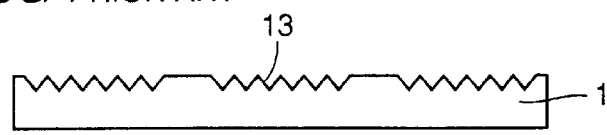
Figure 16A:
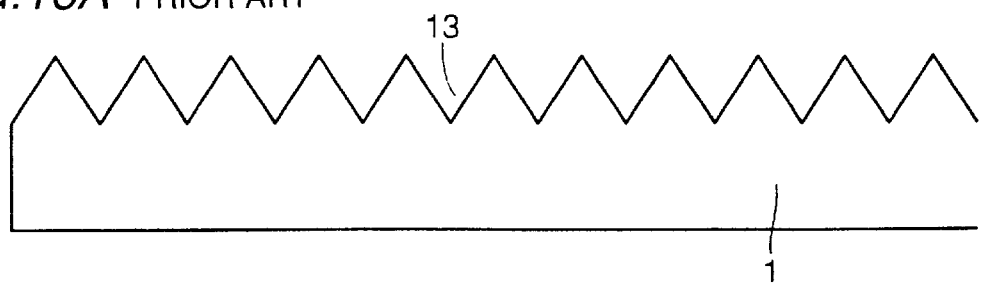
Figure 16B:
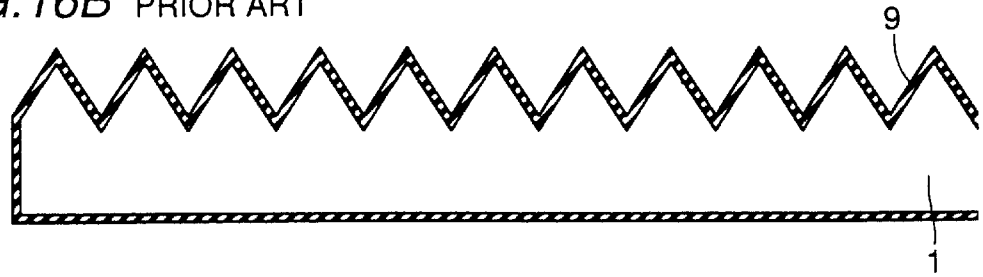
Figure 16C:
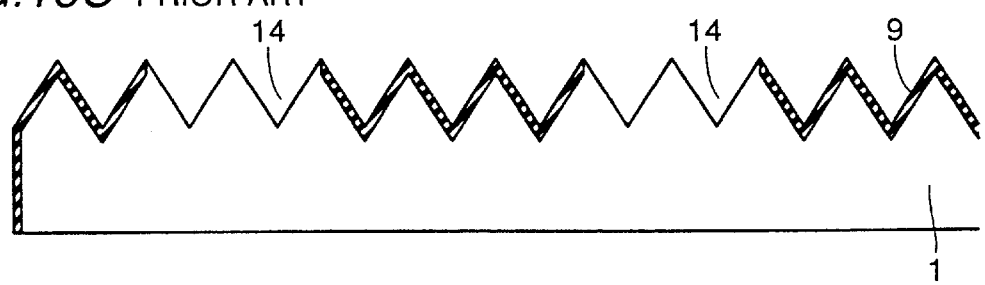
Figure 16D:
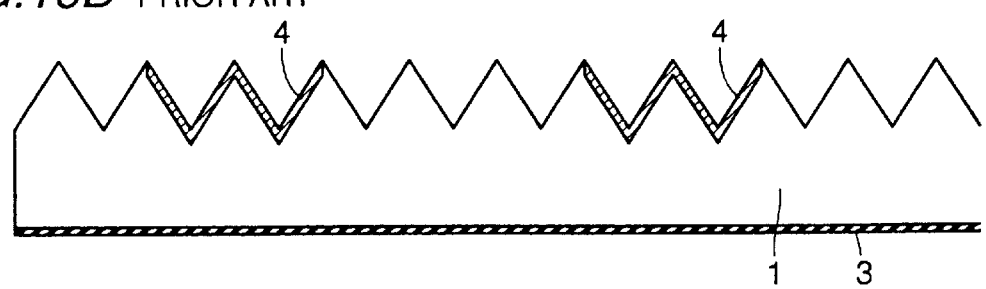
Figure 16E:
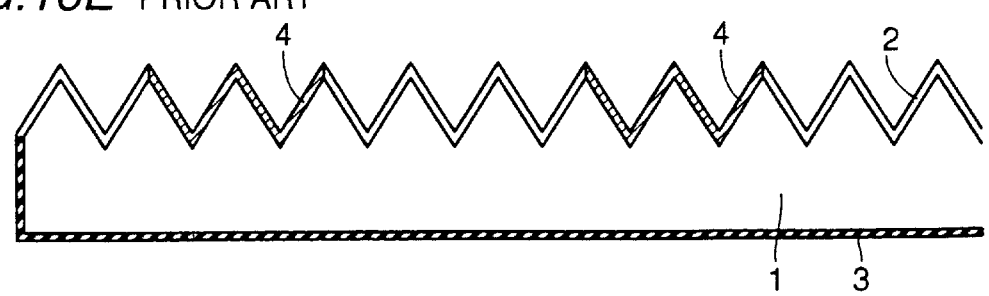

FIGS. 4A and 4B and FIGS. 5A and 5B correspond to respective steps before and after the etching process of silicon substrate 1 in the step of FIG. 15F to form a reflectionless surface construction having a grid configuration of different sizes (for example, reflectionless surface constructions 13a and 13b in FIG. 2). FIGS. 4A and 4B correspond to the case where the distance between each grid in the reflectionless surface structure are set to the same distance "d" irrespective of the size of the grid configurations of reflectionless surface constructions 13a and 13b. FIGS. 5A and 5B correspond to the case where the distance between each grid in respective reflectionless surface constructions is set to different distances $d_1$ and $d_2$ according to the size of the grid configurations of reflectionless surface structures 13a and 13b.

Referring to FIG. 4A, a pattern of the reflectionless surface construction in which distance d between each grid is identical is formed on silicon substrate 1 by oxide film layer 9. The etching proceeds up to the portion indicated by the solid line. When the bottom appears, the etching rate which was identical till then changes such that the etching rate in the lateral direction becomes faster than the downward direction since the (111) plane of substrate 1 exposed by etching is harder to etch than the (100) plane. Then, etching proceeds until the vertex of the pyramid indicated by the broken line is formed. Here, the lateral etching of the small reflectionless surface construction 13b is too excessive to result in overetching at the time the etching of the large reflectionless surface construction 13a ends. Accordingly, the vertex of the small reflectionless surface construction 13b is lost. Eventually, when oxide film layer 9 is removed, small reflectionless surface construction 13b will not be formed as designed, as shown in FIG. 4B. The output is slightly degraded. Also, the appearance is degraded.

In the case of FIG. 5A, etching proceeds up to the portion indicated by the solid line under the status where the pattern of the reflectionless surface construction with different distances $d_1$ and $d_2$ between grids is formed on silicon substrate 1 by oxide film layer 9. When the bottom appears, the etching rate that was identical till then changes to become faster in the lateral direction than the downward direction. The etching proceeds until the vertex of the pyramid indicated by the broken line is formed. Here, distance $d_2$ between grids of oxide film 9 for small reflectionless surface construction 13b is greater than distance $d_1$ between grids of oxide film layer 9 for large reflectionless surface construction 13a ($d_1 < d_2$). Therefore, the etching of small reflectionless surface construction 13b ends at the same time the etching of large reflectionless surface structure 13a ends. Overetching at the portion of reflectionless surface structure 13b as in FIGS. 4A and 4B does not occur. Thus, when oxide film layer 9 is removed, small reflectionless surface construction 13b is formed as designed, as shown in FIG. 5B.

Figure 6:
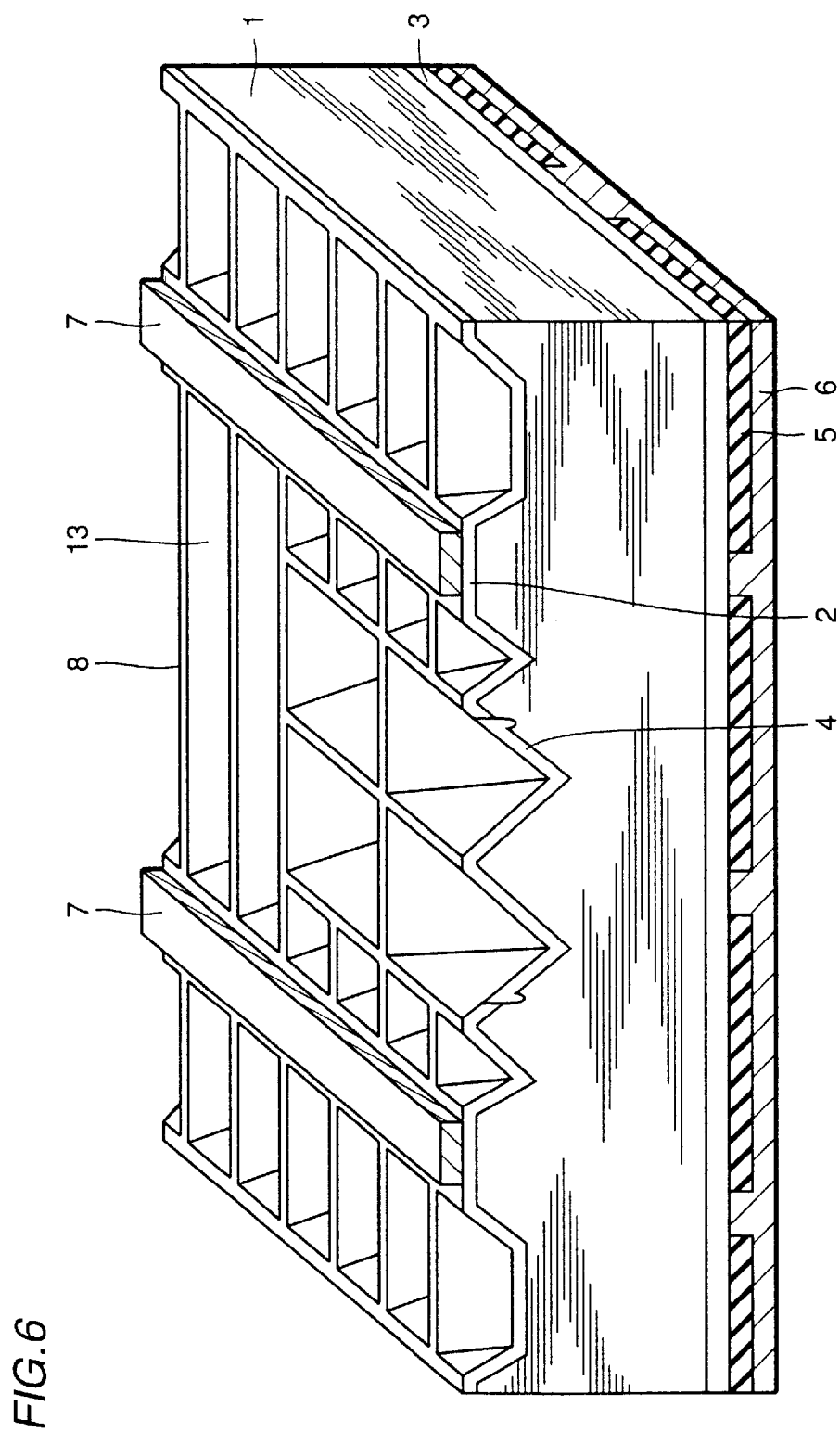
FIG. 6 is a perspective view of a modification of the solar cell of FIG. 1.

FIG. 6 is a perspective view of a solar cell corresponding to a modification of an embodiment of the present invention shown in FIG. 1.

Figure 7:
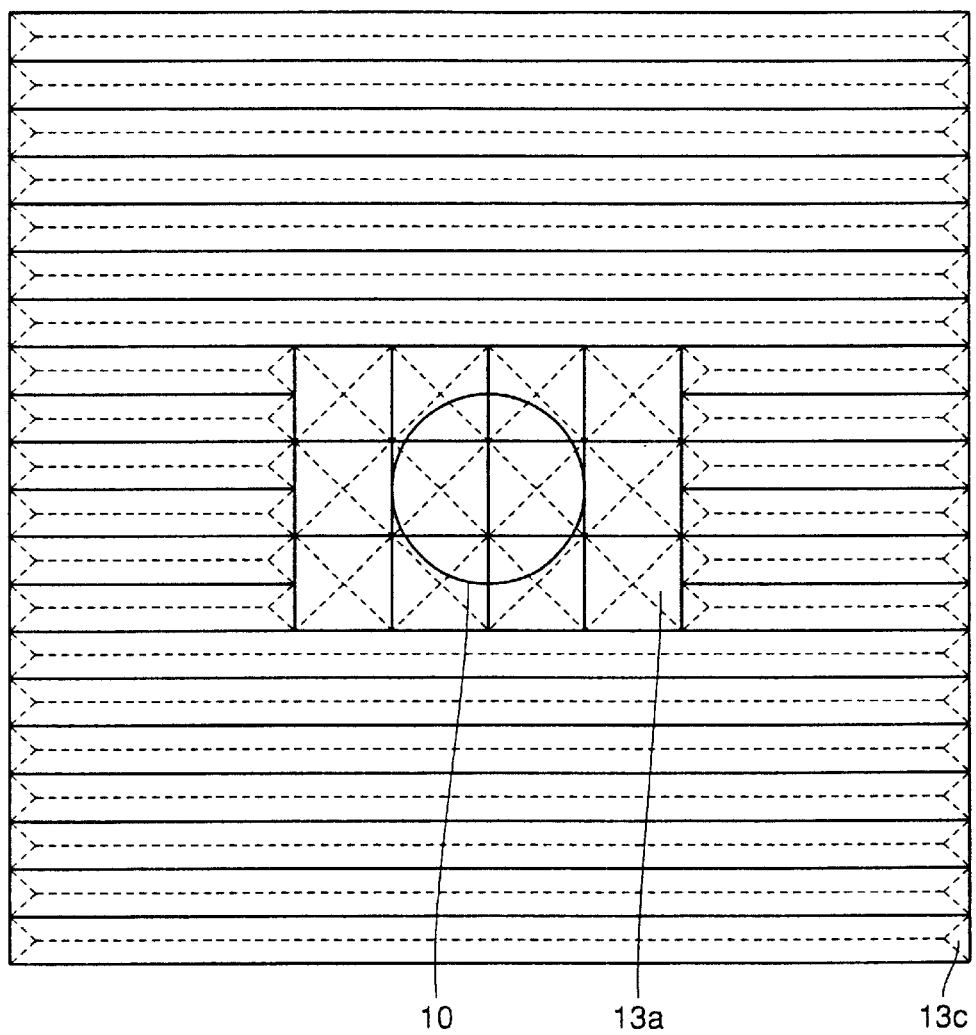
FIG. 7 is a top view of the solar cell of FIG. 6.

FIG. 7 is a top view of the solar cell of FIG. 6.

Referring to the solar cell of FIGS. 6 and 7, reflectionless surface construction 13a corresponding to the conductivity type region to provide the function of the bypass diode has a reversed pyramid shape, and the remaining reflectionless surface construction 13c has a V groove shape. The size of reflectionless surface structure 13a corresponding to the portion where the conductivity type region is provided is set larger than reflectionless surface construction 13c corresponding to the other portion. The distance between each grid in the reflectionless surface construction must be designed according to the above-described manner. The solar cell having such a reflectionless surface construction pattern obtained by the present invention provides advantages similar to those described above.

When a conductivity type region to provide the function of a bypass diode is to be formed on the reflectionless surface construction fabricated as described above, the portion where the conductivity type region is to be formed to provide the function of the bypass diode must be formed in a reflectionless surface construction relatively larger than that of other portions. Accordingly, reverse current can be increased without enlarging the island-like $P^+$ region area. Thus, a solar cell with great reverse current can be provided without degrading the output characteristic.

Figure 8:
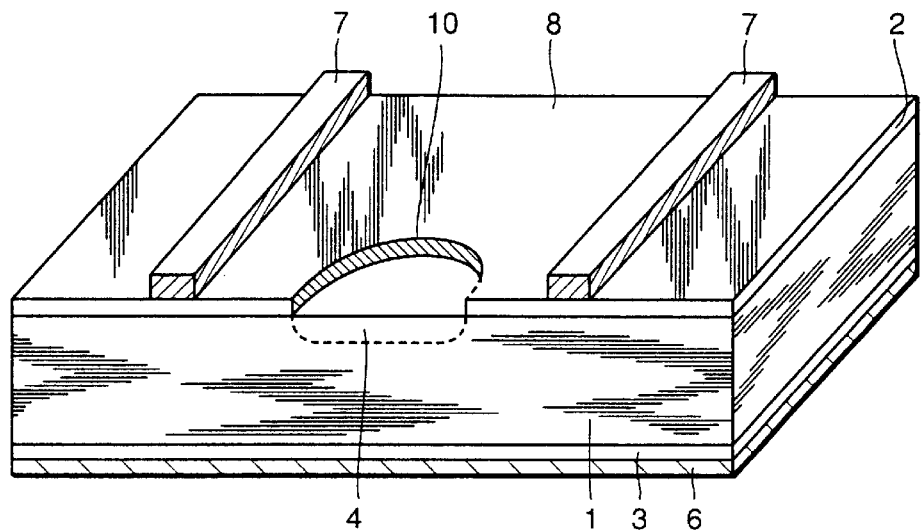
FIG. 8 is a perspective view of a bypass function added solar cell absent of a reflectionless surface construction according to an embodiment of the present invention.

FIG. 8 is a perspective view of a bypass function added solar cell absent of a reflectionless surface construction according to an embodiment of the present invention.

Figure 9:
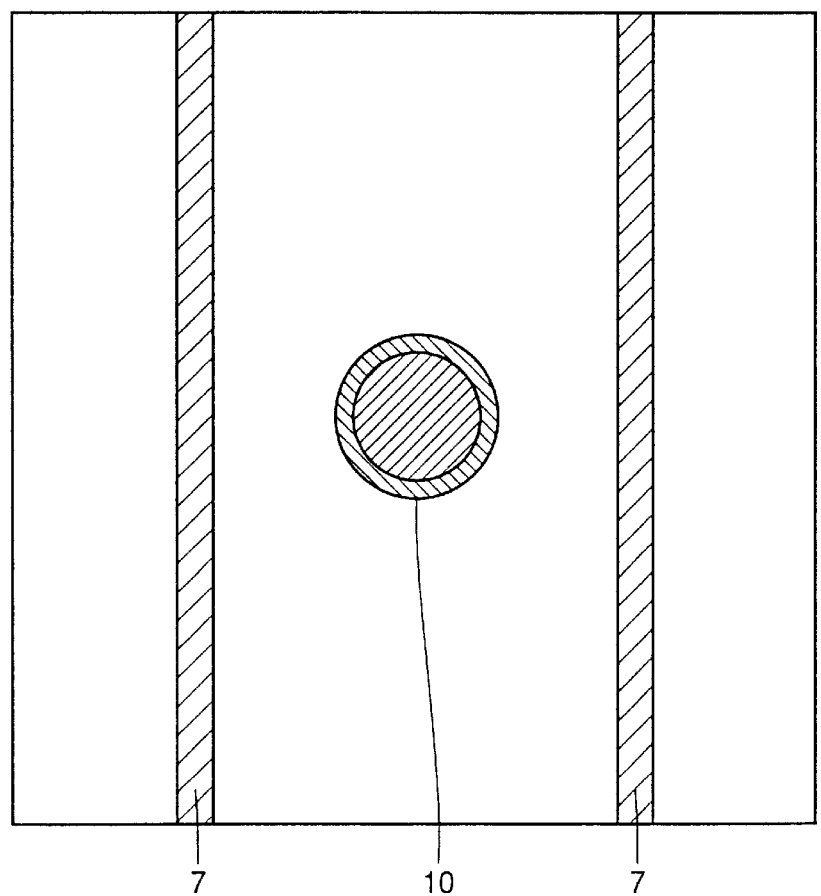
FIG. 9 is a top view of the solar cell of FIG. 8.
Figure 17:
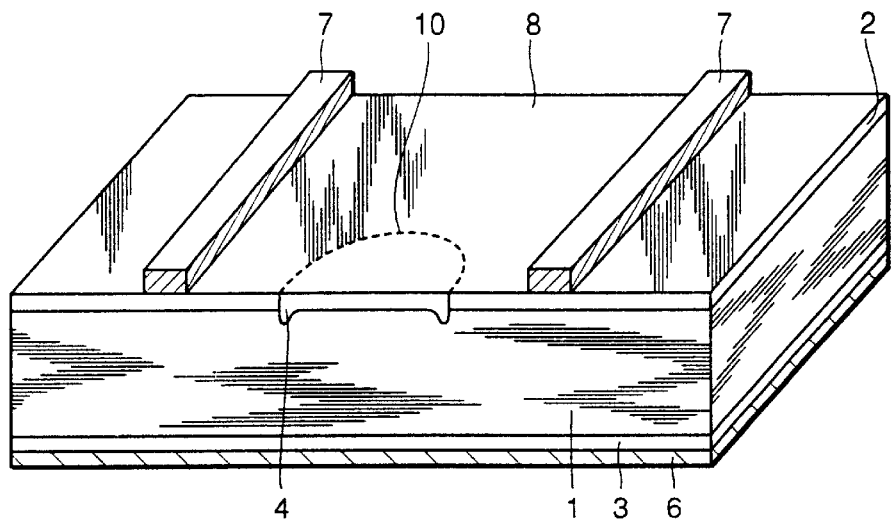
FIG. 17 is a perspective view of another example of a structure a conventional solar cell.
Figure 18:
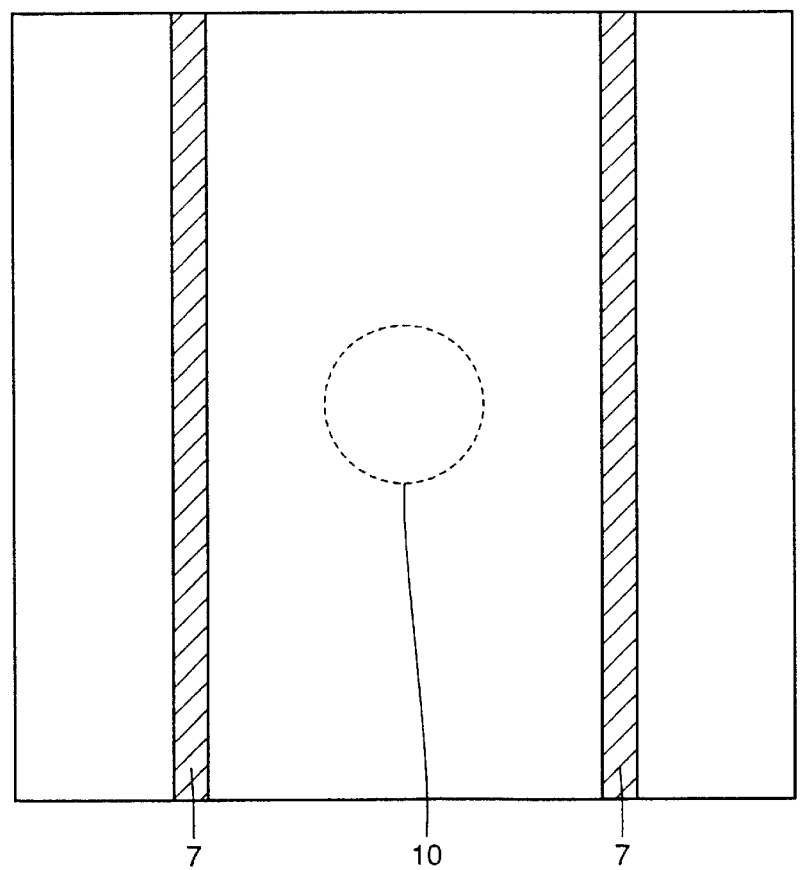
FIG. 18 is a top view of the solar cell of FIG. 17.

FIG. 9 is an enlarged top view of the solar cell of FIG. 8, corresponding to the portion where the conductivity type region is to be provided to add the function of a bypass diode. Referring to FIG. 9, a conductivity type region 10 to provide the bypass diode function is formed in a recess. FIGS. 8 and 9 correspond to FIGS. 17 and 18, respectively, already described with reference to conventional cases. Elements corresponding to those of the conventional solar cell have the same reference character allotted.

The solar cell of the present embodiment differs from the conventional solar cell in that island-like $P^+$ region 4 provided at the light receiving side is formed in a recess unlike the other portions.

FIGS. 11A–11G are sectional views of the bypass function added solar cell of the present invention shown in FIG. 8 to indicate the fabrication thereof. FIGS. 11A–11G corresponds to FIGS. 19A–19G already described with reference to the conventional solar cell. Elements corresponding to those of the conventional solar cell have the same reference character allotted.

Figure 19A:
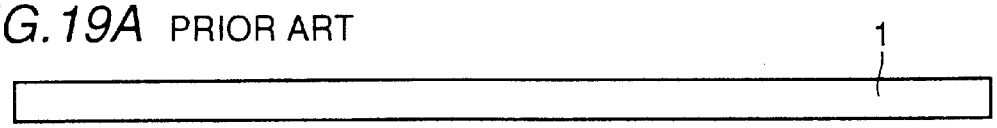
FIGS. 19A–19G are sectional views of the solar cell of FIG. 17 to describe a fabrication method thereof.
Figure 19B:
Figure 19C:
Figure 19D:
Figure 19E:
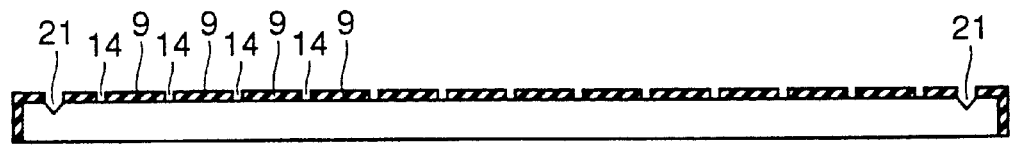
Figure 19F:
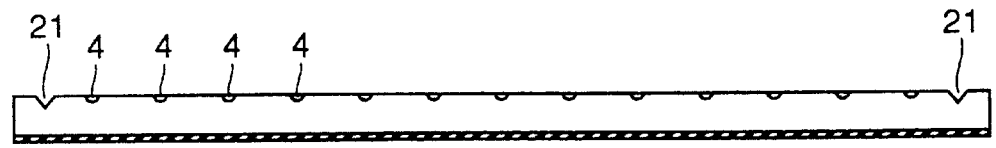
Figure 19G:
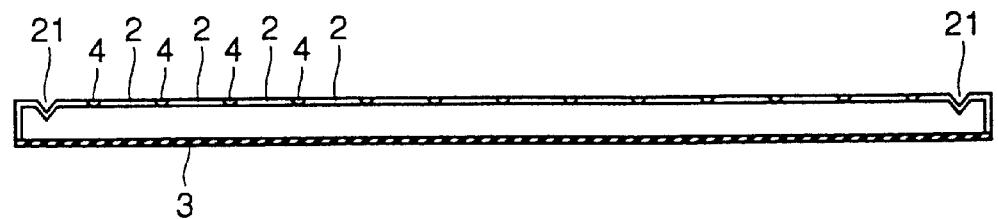
Figure 20:
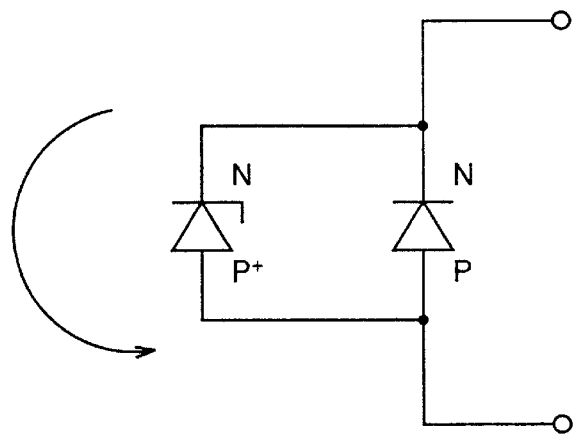
FIG. 20 is an equivalent circuit diagram of a bypass function added solar cell.

The fabrication method of the solar cell of the present embodiment differs from the conventional one in that the number of photolithography steps is reduced as shown in FIGS. 19A–19G. More specifically, photolithography is carried out at FIGS. 19C and 19E in the conventional fabrication method. Alignment mark 20 is formed on the wafer as shown in FIG. 19C, and an opening 14 of the island-like $P^+$ type region is formed in registration with the glass mask using the alignment mark as shown in FIG. 19E.

Figure 11A:
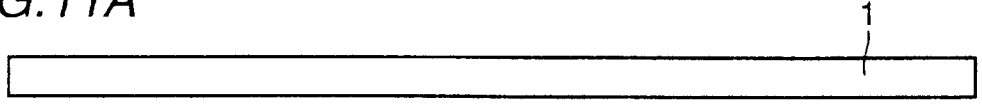
FIGS. 11A–11G are sectional views of the solar cell of FIG. 8 showing a fabrication step thereof.
Figure 11B:
Figure 11C:

In contrast, alignment mark 20 and opening 14 of the island-like $P^+$ region are formed simultaneously at the step of FIG. 11C according to the fabrication method of the present invention. Therefore, the number of steps of photolithography in registration with the glass mask using the alignment mark can be reduced by one step. Therefore, cost reduction can be expected by the improved productivity.

Figure 11D:
Figure 11E:
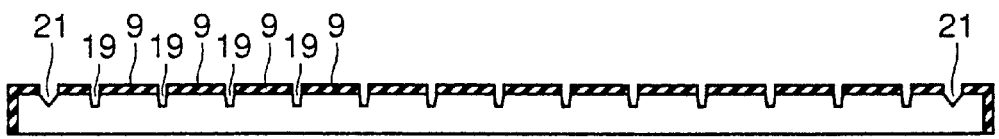
Figure 11F:
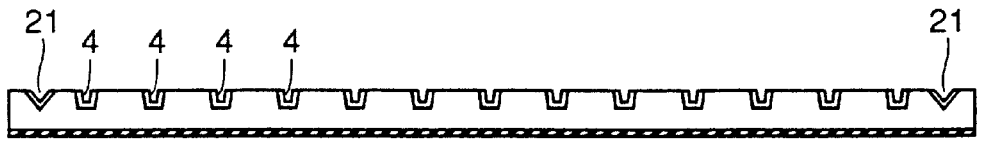
Figure 11G:
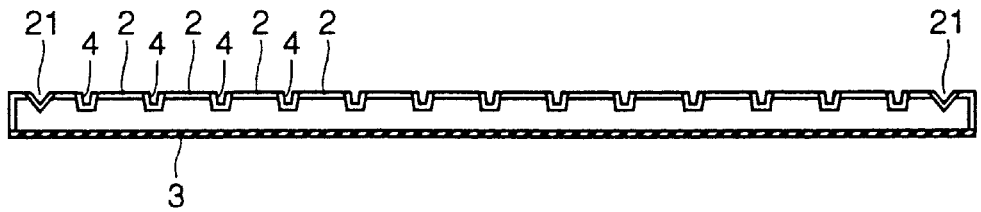
Figure 12A:
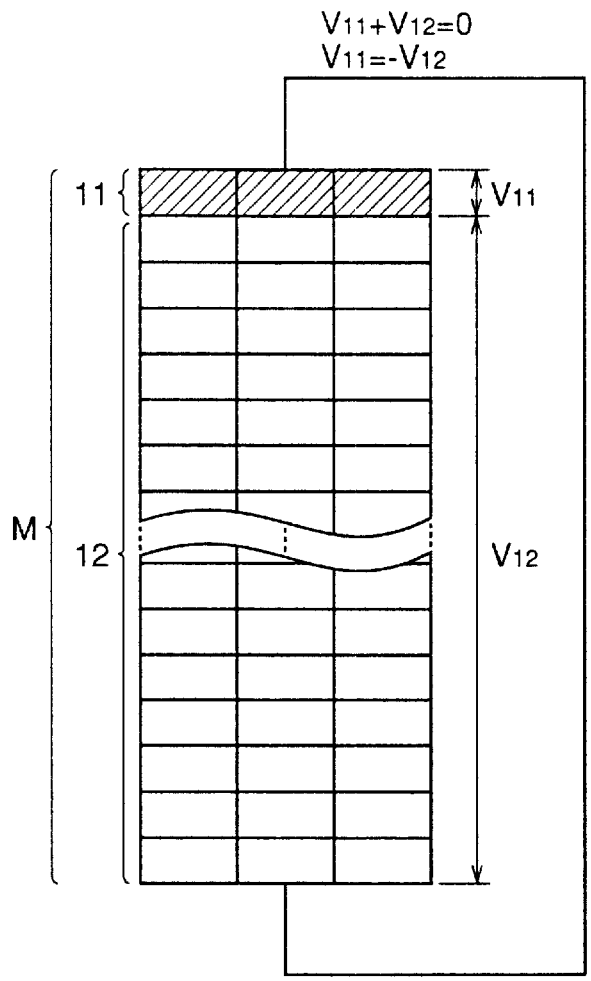
FIGS. 12A and 12B show a structure of a conventional solar cell module.
Figure 12B:
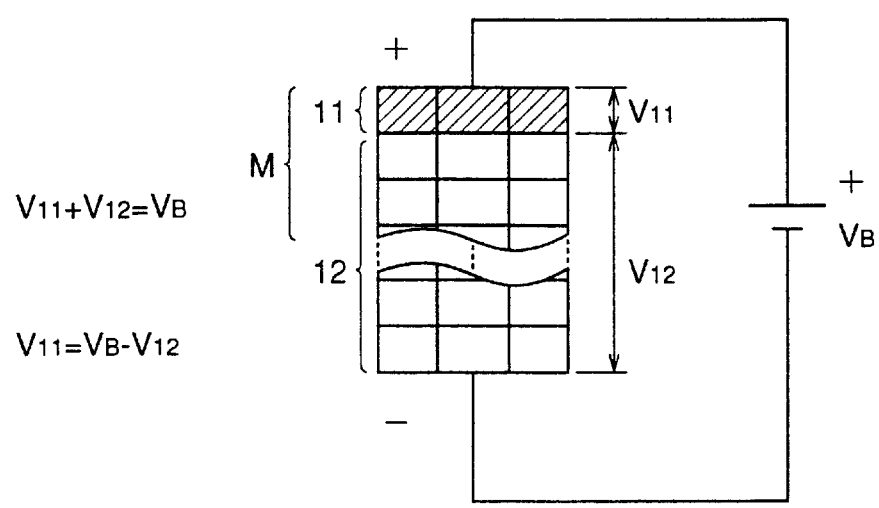

With regard to the simultaneous formation of alignment mark 20 and opening 14 of the island-like $P^+$ region, the island-like $P^+$ region is formed in a recess 19 as shown in FIG. 11D. By increasing the etching processing time using an alkaline solution or the like for the opening of the island-like $P^+$ region, the depth of the recess can be increased to also increase the bias current as shown in FIG. 10. The reverse current can be increased without enlarging the area of the island-like $P^+$ region. Thus, a solar cell with a great reverse current can be provided without degrading the output property.

For the sake of simplification, a solar cell using a P type silicon substrate has been described above. The present invention is also applicable to a solar cell employing an N type substrate or a substrate other than silicon monocrystal such as GaAs.

The above-described embodiments correspond to an non-reflective surface (NRS)/BSF type silicon solar cell or BSFR silicon solar cell. The present invention is also applicable to an NRS/LBSF (where LBSF stands for localized back surface field) type silicon solar cell or BSR silicon solar cell.

Furthermore, the above-described embodiments correspond to the case where the pattern to provide the bypass function is circular and formed at the center of the surface electrode grid. The present invention is also applicable to the case where the pattern is not circular or not formed at the center of the surface electrode grid.

The direction of forming the reflectionless surface structure on the silicon can be changed depending upon the difference of the substrate. The present invention is applicable whatever the direction of forming the reflectionless surface construction may be.

The above-described embodiments correspond to a reflectionless surface construction having the shape of a reversed pyramid. The present invention is also applicable to a reflectionless surface construction of other shapes such as a V groove shape, regular pyramid shape, or the like. Furthermore, the combination thereof is not limited to the combination of the reverse pyramid and V groove shape as described above. The present invention is applicable to other combinations of the reflectionless surface constructions.

The present invention is applicable to both solar cells for terrestrial use and space applications.

According to the present invention, a solar cell that has better performance than the conventional solar cell, not easily vulnerable to short-circuit failure by reverse bias voltage, can be fabricated at low cost. Particularly in the application of a solar cell array for space use that has difficulty in maintenance, significant advantage is exhibited as to the protection with respect to reverse bias voltage, which in turn improves the reliability of the entire array.

Since an externally provided diode is not required in the present invention, the fabrication cost of the solar cell can be reduced.

By setting the size of the reflectionless surface construction corresponding to the portion of the conductivity type region to provide the bypass diode function larger than other portions, more reverse current can be conducted even if the area of the conductivity type region is not increased. As a result, the device property can be improved than that of the conventional high-efficiency bypass function added solar cell.

By forming the conductivity type region to provide the bypass diode function in a recess by etching in the case of a solar cell that is absent of the reflectionless surface construction at the light receiving side, the fabrication step can be reduced than those of the conventional cell to realize cost reduction. By increasing the depth of the recess, more reverse current can be conducted even if the area of the conductivity type region is not increased. As a result, the device property can be improved than the conventional solar cell with the bypass function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:
    a substrate of a first conductivity type,
    a region of a second conductivity type formed at a light receiving side of said substrate,
    an electrode formed at said region of a second conductivity type, and
    a region of higher impurity concentration than said substrate and of the same conductivity type as the substrate, wherein the region of higher impurity concentration is arranged in contact with both said substrate and said region of the second conductivity type, but not in contact with said electrode,
    said substrate including a reflectionless surface construction and a planar portion at the light receiving side thereof,
    wherein said reflectionless surface construction comprises a plurality of grid configurations including a first grid portion and a second grid portion, the second grid portion having a grid configuration differing in size from a grid configuration of said first grid portion,
    wherein said region of higher impurity concentration than the substrate is formed at said first grid portion.

2. The solar cell according to claim 1, wherein the size of each grid configuration of said first grid portion is greater than the size of each grid configuration of the second grid portion in said reflectionless surface construction.

3. The solar cell according to claim 1, wherein the grid configurations of said first and second grid portions of said reflectionless surface construction are different configurations.

4. The solar cell according to claim 1, wherein the distance between each grid of the first grid portion differs from the distance between each grid of the second grid portions in said reflectionless surface construction.

5. The solar cell according to claim 4, wherein the distance between each grid of the first grid portion is smaller than the distance between each grid of the second grid portion in said reflectionless surface construction.

6. The solar cell of claim 1, wherein the region of higher impurity concentration which is of the first conductivity type is formed as an island so as to be surrounded on all lateral sides by the region of the second conductivity type.

7. A method of fabricating a solar cell including a substrate of a first conductivity type, a region of a second conductivity type formed at a light receiving side of said substrate, an electrode formed at the region of the second conductivity type, and a region of higher impurity concentration than said substrate and of the same conductivity type as the substrate being arranged in contact with both said substrate and said region of the second conductivity type but not in contact with said electrode, wherein said substrate includes a reflectionless surface construction and a planar portion at the light receiving side, said reflectionless surface construction having a plurality of grid configurations, and including a first grid portion and a second grid portion having a grid configuration differing in size from the grid configuration of the first grid portion, said region of higher impurity concentration than said substrate being formed at said first grid portion,
    said fabrication method comprising:
        forming a masking pattern on said substrate using an oxide film, and etching said substrate with said masking pattern as a mask,
        wherein a line width of the masking pattern located at said second grid configuration is greater than the line width of the masking pattern located at said first grid portion.

8. A solar cell comprising:
    a substrate of a first conductivity type,
    a second conductivity type region on a light receiving side of said substrate,
    an electrode formed over the second conductivity type region, and
    an island region of higher impurity concentration than said substrate and of the same conductivity type as the substrate, wherein the island region of higher impurity concentration contacts said second conductivity type region but does not contact said electrode,
    a gridded surface construction at a light receiving side of the substrate, said gridded surface construction comprising a first grid portion located at least partially at the island region of higher impurity concentration and a second grid portion laterally surrounding the first grid portions on all lateral sides thereof, and
    wherein the first grid portion comprises larger grid structures than said second grid portion.

* * * * *